United States Patent
Jo et al.

(10) Patent No.: US 11,159,147 B2
(45) Date of Patent: Oct. 26, 2021

(54) FRONT END MODULE

(71) Applicant: Samsung Electro-Mechanics Co., Ltd., Suwon-si (KR)

(72) Inventors: Kang Ta Jo, Suwon-si (KR); Seong Jong Cheon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 44 days.

(21) Appl. No.: 16/655,282

(22) Filed: Oct. 17, 2019

(65) Prior Publication Data

US 2020/0328729 A1    Oct. 15, 2020

(30) Foreign Application Priority Data

Apr. 10, 2019  (KR) .......................... 10-2019-0042004
Jun. 11, 2019  (KR) .......................... 10-2019-0068924

(51) Int. Cl.
*H01Q 5/00*    (2015.01)
*H03H 11/34*   (2006.01)
(Continued)

(52) U.S. Cl.
CPC ......... *H03H 11/342* (2013.01); *H01Q 1/2291* (2013.01); *H01Q 1/242* (2013.01);
(Continued)

(58) Field of Classification Search
CPC ...... H03H 11/342; H03H 9/54; H03H 11/245; H03H 11/28; H04H 7/0115; H01Q 5/335; H01Q 1/2291; H01Q 1/242

See application file for complete search history.

(56) References Cited

U.S. PATENT DOCUMENTS 7,412,255 B2 *  8/2008  Klemetti ................ H01Q 1/241
                                                   455/422.1
2003/0203743 A1  10/2003  Sugar et al.
(Continued)

FOREIGN PATENT DOCUMENTS

CN    101166030 A    4/2008
CN    105553505 A    5/2016
(Continued)

OTHER PUBLICATIONS

Korean Office Action dated May 22, 2020 in corresponding Korean Patent Application No. 10-2019-0068924 (6 pages in English, 5 pages in Korean).
(Continued)

*Primary Examiner* — Dinh T Le
(74) *Attorney, Agent, or Firm* — NSIP Law

(57) ABSTRACT

A front end module includes: a first antenna terminal; a second antenna terminal; a switch including a plurality of first side terminals on a first side and a plurality of second side terminals on a side opposite to the first side, each of the first side terminals being connected to one of the first antenna terminal and the second antenna terminal; a first filter connected to the first antenna terminal; a second filter connected to the first antenna terminal; a third filter connected to one of the second side terminals; and a fourth filter connected to one of the second side terminals. The third filter and the fourth filter are connected to one of the first antenna terminal and the second antenna terminal.

9 Claims, 11 Drawing Sheets

(51) Int. Cl.
*H03H 7/01* (2006.01)
*H03H 9/54* (2006.01)
*H01Q 1/24* (2006.01)
*H03H 11/28* (2006.01)
*H01Q 1/22* (2006.01)
*H01Q 5/335* (2015.01)
*H03H 11/24* (2006.01)

(52) U.S. Cl.
CPC ........... *H01Q 5/335* (2015.01); *H03H 7/0115* (2013.01); *H03H 9/54* (2013.01); *H03H 11/245* (2013.01); *H03H 11/28* (2013.01)

(56) References Cited

U.S. PATENT DOCUMENTS

| | | |
|---|---|---|
| 2008/0166980 A1 | 7/2008 | Fukamachi et al. |
| 2016/0294423 A1* | 10/2016 | Yatsenko ............. H03H 9/6483 |
| 2017/0045603 A1* | 2/2017 | Krauska ............... G01R 35/005 |
| 2017/0093554 A1 | 3/2017 | Ebihara et al. |
| 2018/0034152 A1 | 2/2018 | Mura et al. |
| 2019/0312336 A1* | 10/2019 | Son ........................ H04B 1/401 |

FOREIGN PATENT DOCUMENTS

| | | |
|---|---|---|
| CN | 105827269 A | 8/2016 |
| CN | 106468739 A | 3/2017 |
| JP | 2001-148638 A | 5/2001 |
| JP | 2004-032390 A | 1/2004 |
| JP | 2005-269305 A | 9/2005 |
| JP | 2007-295327 A | 11/2007 |
| KR | 10-2017-0020786 A | 2/2017 |
| KR | 10-2018-0006653 A | 1/2018 |
| WO | 2015/199990 A1 | 12/2015 |

OTHER PUBLICATIONS

Chinese Office Action dated Jul. 5, 2021, and the accompanying Search Report dated Jun. 29, 2021, in counterpart Chinese Patent Application No. 202010004362.3 (16 pages in English and 10 pages in Chinese).

* cited by examiner

FRONT END MODULE

CROSS-REFERENCE TO RELATED APPLICATIONS

This application claims the benefit under 35 USC 119(a) of Korean Patent Application No. 10-2019-0042004 filed on Apr. 10, 2019 and Korean Patent Application No. 10-2019-0068924 filed on Jun. 11, 2019 in the Korean Intellectual Property Office, the entire disclosures of which are incorporated herein by reference for all purposes.

BACKGROUND

1. Field

The following description relates to a front end module.

2. Description of Background

Fifth generation (5G) communications are expected to connect more devices to each other efficiently with larger amounts of data and faster data transfer rates, as compared to conventional long term evolution (LTE) communications.

5G communications are developing in a direction of using a frequency band of 24250 MHz to 52600 MHz, corresponding to a millimeter wave (mmWave) band, and a frequency band of 450 MHz to 6000 MHz corresponding to a sub-6 GHz band.

Each of the n77 band (3300 MHz to 4200 MHz), the n78 band (3300 MHz to 3800 MHz), and the n79 band (4400 MH to 5000 MHz) is defined as one among sub-6 GHz operating bands, and the n77 band (3300 MHz to 4200 MHz), the n78 band (3300 MHz to 3800 MHz), and the n79 band (4400 MH to 5000 MHz) are expected to be used as main bands, due to the advantages of having wide bandwidths.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A front end module capable of providing various platforms.

In one general aspect, a front end module includes: a first antenna terminal connected to a first antenna; a second antenna terminal connected a second antenna; a switch including a plurality of first side terminals and a plurality of second side terminals opposite to the first side terminals, each of the first side terminals being connected to one of the first antenna terminal and the second antenna terminal; a first filter connected to the first antenna terminal, and having a passband of a first frequency band; a second filter connected to the first antenna terminal, and having a passband of a second frequency band; a third filter connected to one of the second side terminals, and having a passband of a third frequency band; and a fourth filter connected to one of the second side terminals, and having a passband of a fourth frequency band, and the third filter and the fourth filter are connected to one of the first antenna terminal and the second antenna terminal.

The first side terminals may include a first terminal connected to the first antenna terminal and a second terminal connected to the second antenna terminal, and the second side terminals may include a third terminal connected to the third filter and a fourth terminal connected to the fourth filter.

The switch may include a first connector having a first end connected to the first terminal and a second end connected to one of the third terminal and the fourth terminal, or off-operated; and a second connector having a first end connected to the second terminal and a second end configured to be connected to one of the third terminal and the fourth terminal, or off-operated.

One of the third terminal and the fourth terminal may be connected to no more than one of the first connector and the second connector.

The second end of the first connector may be connected to the third terminal, and the second end of the second connector may be connected to the fourth terminal.

The second end of the first connector may be connected to the fourth terminal, and the second end of the second connector may be connected to the third terminal.

The switch may include a fifth terminal connected to a matching network providing an open state, with respect to a signal path among the first antenna terminal, the first filter, and the second filter.

The first connector may be connected to the fifth terminal in a case in which the first connector is off-operated.

The front end module may include a fifth filter disposed between the first antenna terminal and the first terminal, and the fifth filter may provide attenuation characteristics of 40 dB or more to the third filter and the fourth filter.

The front end module may include a sixth filter disposed in a signal path among the first antenna terminal, the first filter, and the second filter, and the sixth filter may provide attenuation characteristics of 40 dB or more to the first filter and the second filter.

The first filter may support cellular communications in a sub-6 GHz band, the second filter may support Wi-Fi communications in a 5 GHz band, the third filter may support Wi-Fi communications in a 2.4 GHz band, and the fourth filter may support cellular communications in a sub-3 GHz band.

Each of the first filter, the second filter, and the fourth filter may include an inductor-capacitor (LC) filter, and the third filter may include a bulk acoustic wave (BAW) filter.

In another general aspect, a front end module includes: a first antenna terminal connected to a first antenna; a second antenna terminal connected a second antenna; a switch including a plurality of first side terminals on a first side and a plurality of second side terminals on a second side opposite to the first side, each of the first side terminals being connected to one of the first antenna terminal and the second antenna terminal; at least one main filter connected to the first antenna terminal; and a plurality of subfilters, each of the plurality of subfilters being connected to a different one of the second side terminals and configured to be connected to a different one of the first antenna terminal and the second antenna terminal.

In another general aspect, a front end module includes: a first antenna terminal connected to a first antenna; a second antenna terminal connected a second antenna; at least three filters having passbands with different frequency bands, the at least three filters including a first filter connected to the first antenna terminal, a second filter to be connected to the first antenna terminal and the second antenna terminal, and a third filter to be connected to the first antenna terminal and second antenna terminal; and a switch to selectively connect the second filter to the first antenna terminal and the second antenna terminal and to selectively connect the third filter to the first antenna terminal and the second antenna terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
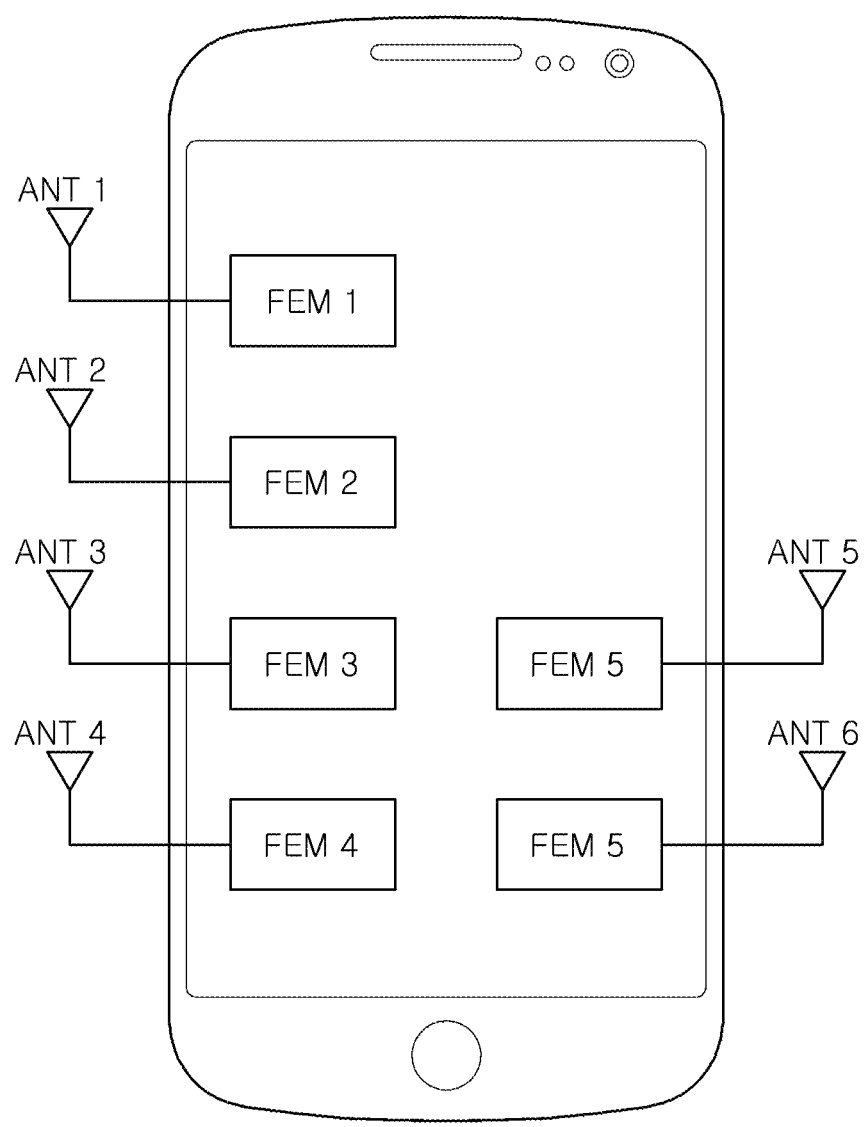
FIG. 1 is a block diagram illustrating a mobile device on which a front end module according to an example is mounted.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating a mobile device on which a front end module according to an example.

Referring to FIG. 1, a mobile device 1 includes a plurality of antennas ANT1 to ANT6 and a plurality of front end modules FEM1 to FEM6, which are connected to different antennas of the plurality of antennas ANT1 to ANT6.

The mobile device 1 performs a plurality of standard wireless communications such as cellular (LTE/WCDMA/GSM) communications, Wi-Fi communications of 2.4 GHz and 5 GHz, Bluetooth communications, and the like. The plurality of antennas ANT1 to ANT6 and the plurality of front end modules FEM1 to FEM6, included in the mobile device 1, support a plurality of standard wireless communications.

A Multi-Input/Multi-Output (MIMO) system may be applied to the mobile device 1. MIMO is a technique provided for increasing a bandwidth in proportion to the number of antennas. When the N number of antennas is used, N times frequency efficiency can be obtained compared with a single antenna. However, due to the slimming and miniaturization of mobile devices, there is a limitation in the space in which the antenna is mounted, and there are physical limitations in additionally implementing a plurality of antennas in a terminal under the condition in which the antennas, used in the system according to the related art, are provided. Thus, a front end module, connected to any one of the antennas, needs to support a plurality of standard wireless communications.

Even when MIMO is applied to a mobile device, various mobile devices can employ different numbers of antennas. That is, even when a single front end module is designed to support a plurality of standard wireless communications using a single antenna, there is an extra antenna available in a mobile device. In this case, it may be advantageous in terms of frequency efficiency to perform wireless communications using different antennas. Thus, the front end module needs to support various types of platform.

Figure 2:
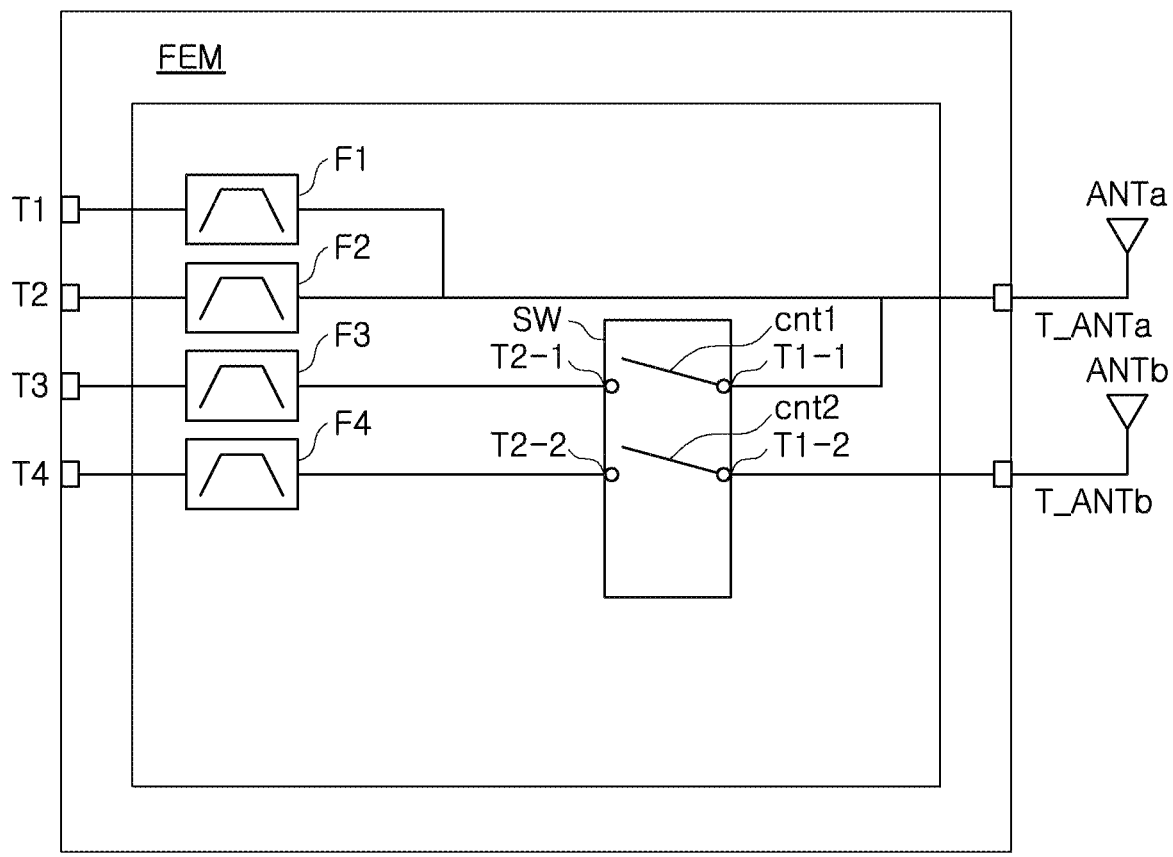
FIGS. 2 and 3 are block diagrams of a front end module according to an example.
Figure 3:
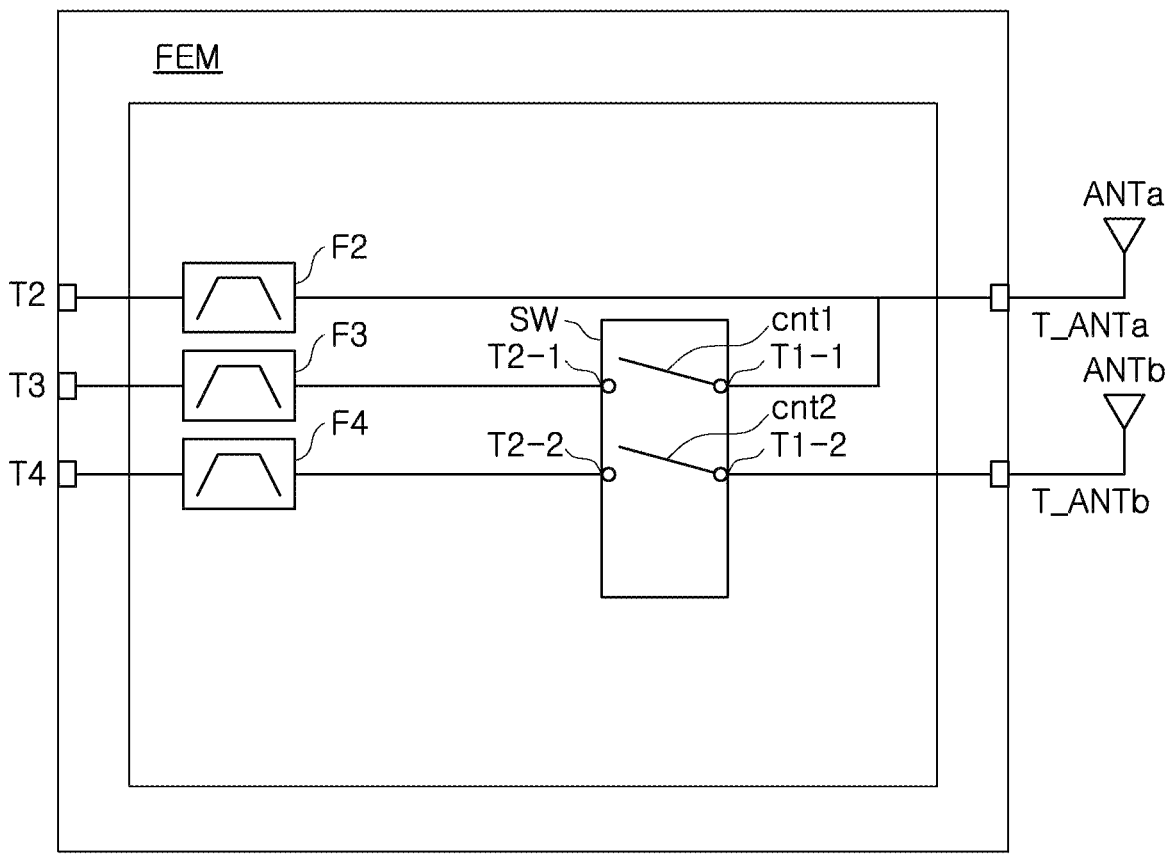

FIGS. 2 and 3 are block diagrams of a front end module according to an example.

A front end module includes a first filter F1, a second filter F2, a third filter F3, a fourth filter F4, and a switch SW, and may further include a first antenna terminal T_ANTa, a second antenna terminal T_ANTb, a first terminal T1, a second terminal T2, a third terminal T3, and a fourth terminal T4. A first antenna ANTa may be connected to the first antenna terminal T_ANTa, and a second antenna ANTb may be connected to the second antenna terminal T_ANTb.

The first filter F1, the second filter F2, the third filter F3, the fourth filter F4, and the switch SW may form a switched triplexer.

The first filter F1 and the second filter F2 may be understood as a main filter, always connected to the first antenna terminal T_ANTa, and the third filter F3 and the fourth filter F4 may be understood as a subfilter, connected to the first antenna terminal T_ANTa and the second antenna terminal T_ANTb, selectively, through the switch SW. The first filter F1 and the second filter F2 may form a main filter unit, and the third filter F3 and the fourth filter F4 may form a subfilter unit.

The first filter F1 is disposed between the first antenna terminal T_ANTa and the first terminal T1. One end of the first filter F1 is connected to the first antenna terminal T_ANTa, and the other end of the first filter F1 is connected to the first terminal T1.

The first filter F1 supports cellular communications in a first frequency band, particularly, in a sub-6 GHz band. As an example, the first filter F1 may support cellular communications in a 3.3 GHz to 4.2 GHz band (n77 band). According to an example, the first filter F1 may support cellular communications in a 3.3 GHz to 3.8 GHz band (an n78 band).

The first filter F1 is operated as a band pass filter. As an example, the first filter F1 may include a band pass filter having a passband of a 3.3 GHz to 4.2 GHz band, and having a lower frequency limit of 3.3 GHz and an upper frequency limit of 4.2 GHz. According to an example, the first filter F1 may include a band pass filter having a passband of 3.3 GHz to 3.8 GHz band, and having a lower frequency limit of 3.3 GHz and an upper frequency limit of 3.8 GHz.

Referring to FIG. 3, the first filter F1 is omitted from the front end module, and the front end module may be formed by the second filter F2, the third filter F3, the fourth filter F4, and the switch SW.

The second filter F2 is disposed between the first antenna terminal T_ANTa and the second terminal T2. One end of the second filter F2 is connected to the first antenna terminal T_ANTa, and the other end of the second filter F2 is connected to the second terminal T2.

The second filter F2 supports Wi-Fi communications in a second frequency band, particularly, in a 5 GHz band. As an example, the second filter F2 may support Wi-Fi communications in a 5.15 GHz to 5.950 GHz band.

The second filter F2 is operated as a band pass filter. As an example, the second filter F2 may include a band pass filter having a passband of a 5.15 GHz to 5.950 GHz band, and having a lower frequency limit of 5.15 GHz and an upper frequency limit of 5.950 GHz.

Each of the first filter F1 and the second filter F2 are connected to the first antenna terminal T_ANTa. Thus, the first antenna ANTa, connected to the first antenna terminal T_ANTa, may simultaneously perform cellular communications in a Sub-6 GHz band and Wi-Fi communications in a 5 GHz band.

Referring to FIG. 2, a first filter F1, supporting cellular communications in a sub-6 GHz band, and a second filter F2, supporting Wi-Fi communications in a 5 GHz band, share a single antenna. Thus, as compared with the case in which different filters are connected to different antennas, it is necessary to have higher attenuation characteristics.

As an example, in the case that each of the first filter F1 and the second filter F2 requires attenuation characteristics of 25 dB, in the case in which the first filter F1, supporting cellular communications in a sub-6 GHz band, and the second filter F2, supporting Wi-Fi communications in a 5 GHz band, are connected to separate antennas. In this case, in the case in which the first filter F1 and the second filter F2 are connected to a single antenna, antenna isolation characteristics of 10 dB are additionally required. Thus, it is necessary for each of the first filter F1 and the second filter F2 to have total attenuation characteristics of 35 dB or more.

Although a BAW filter has excellent attenuation characteristics, the BAW filter is not easily applied to the fifth-generation communications, requiring broadband frequency characteristics, because it is difficult to form a wide passband. Thus, in order to satisfy broadband frequency characteristics, the first filter F1 and the second filter F2 according to an example may be provided as an LC filter, implemented as a combination of a capacitor and an inductor.

The third filter F3 is disposed between the switch SW and the third terminal T3. One end of the third filter F3 is connected to the switch SW, and the other end of the third filter F3 is connected to the third terminal T3.

The third filter F3 supports Wi-Fi communications in a third frequency band, particularly, in a 2.4 GHz band. As an example, the third filter F3 may support Wi-Fi communications in a 2.4 GHz to 2.4835 GHz band.

The third filter F3 is operated as a band pass filter. As an example, the third filter F3 may include a band pass filter having a passband of a 2.4 GHz to 2.4835 GHz band, and having a lower frequency limit of 2.4 GHz and an upper frequency limit of 2.4835 GHz.

As an example, the third filter F3 may be composed of a BAW filter having excellent attenuation characteristics. The third filter F3, composed of a BAW filter, may have sufficient attenuation characteristics, with respect to an adjacent LTE B40/B41 band.

The fourth filter F4 is disposed between the switch SW and the fourth terminal T4. One end of the fourth filter F4 is connected to the switch SW, and the other end of the fourth filter F4 is connected to the fourth terminal T4.

The fourth filter F4 supports cellular communications in a fourth frequency band, particularly, in a sub-3 GHz band. As an example, the fourth filter F4 may support cellular communications in a 1.7 GHz to 2.0 GHz band (LTE MB), or may support cellular communications in a 2.3 GHz to 2.7 GHz band (LTE HB).

The fourth filter F4 is operated as a lowpass filter. As an example, the fourth filter F4 may include a lowpass filter having a passband of 2.0 GHz or less or 2.7 GHz or less, and having an upper frequency limit of 2.0 GHz or 2.7 GHz. The fourth filter F4 may be composed of an LC filter, and may be integrated into a single filter together with the first filter F1 and the second filter F2, composed of an LC filter.

The switch SW may be provided as a four terminal switch in the double pole double throw (DPDT) form. The switch SW includes a plurality of first side terminals, provided on a first side, and a plurality of second side terminals, provided on a second side, corresponding to a side opposite to the first side. The first side is a side of the first antenna terminal T_ANTa and the second antenna terminal T_ANTb, and the second side is a side of the third filter F3 and the fourth filter F4.

The plurality of first side terminals may include a first-1 terminal T1-1 and a first-2 terminal T1-2, disposed in the switch SW on a side of the first antenna terminal T_ANTa and the second antenna terminal T_ANTb, and the plurality of second side terminals may include a second-1 terminal T2-1 and a second-2 terminal T2-2, disposed in the switch SW on a side of the third filter F3 and the fourth filter F4. The switch SW may further include a first connector cnt1 and a second connector cnt2.

The first-1 terminal T1-1 is connected to the first antenna terminal T_ANTa, the first-2 terminal T1-2 is connected to the second antenna terminal T_ANTb, the second-1 terminal T2-1 is connected to the third filter F3, and the second-2 terminal T2-2 is connected to the fourth filter F4.

One end of the first connector cnt1 is connected to the first-1 terminal T1-1, and the other end of the first connector is selectively connected to one of the second-1 terminal T2-1 and the second-2 terminal T2-2, or is off-operated and thus may not be connected to any terminal. Thus, the first-1 terminal T1-1 may be connected to one of the second-1 terminal T2-1 and the second-2 terminal T2-2 according to a switching operation of the first connector cnt1, or may not be connected to any terminal.

One end of the second connector cnt2 is connected to the first-2 terminal T1-2, and the other end of the second connector is connected to one of the second-1 terminal T2-1 and the second-2 terminal T2-2, or is off-operated and thus may not be connected to any terminal. Thus, the first-2 terminal T1-2 may be connected to one of the second-1 terminal T2-1 and the second-2 terminal T2-2 according to a switching operation of the first connector cnt1, or may not be connected to any terminal.

One terminal among the second-1 terminal T2-1 and the second-2 terminal T2-2 may be connected to one or less connector among the first connector cnt1 and the second connector cnt2. Thus, one terminal among the second-1 terminal T2-1 and the second-2 terminal T2-2 is connected to one connector among the first connector cnt1 and the second connector cnt2, or may not be connected to either of the first connector cnt1 and the second connector cnt2.

Various combinations of filters may be connected to the first antenna ANTa and the second antenna ANTb, according to a switching operation of the first connector cnt1 and the second connector cnt2.

As an example, when the first connector cnt1 allows the first-1 terminal T1-1 and the second-1 terminal T2-1 to be connected to each other, the second filter F2, supporting Wi-Fi communications in a 5 GHz band, and the third filter F3, supporting Wi-Fi communications in a 2.4 GHz band, may be connected to a single first antenna ANTa.

Moreover, when the first connector cnt1 allows the first-1 terminal T1-1 and the second-2 terminal T2-2 to be connected to each other, the second filter F2, supporting Wi-Fi communications in a 5 GHz band, and the fourth filter F4, supporting cellular communications in a sub-3 GHz band, may be connected to a single first antenna ANTa.

Moreover, when the second connector cnt2 allows the first-2 terminal T1-2 and the second-1 terminal T2-1 to be connected to each other, the second filter F2, supporting Wi-Fi communications in a 5 GHz band, and the third filter F3, supporting Wi-Fi communications in a 2.4 GHz band, may be connected to different antennas.

In addition, when the second connector cnt2 allows the first-2 terminal T1-2 and the second-2 terminal T2-2 to be connected to each other, the second filter F2, supporting Wi-Fi communications in a 5 GHz band, and the fourth filter F4, supporting cellular communications in a sub-3 GHz band, may be connected to different antennas.

Moreover, in addition to the configurations described above, the first connector cnt1 allows the first-1 terminal T1-1 and the second-1 terminal T2-1 to be connected to each other, the second connector cnt2 allows the first-2 terminal T1-2 and the second-2 terminal T2-2 to be connected to each other, the third filter F3 is connected to the first antenna ANTa, and the fourth filter F4 is connected to the second antenna ANTb. Further, the first connector cnt1 allows the first-1 terminal T1-1 and the second-2 terminal T2-2 to be connected to each other, the second connector cnt2 allows the first-2 terminal T1-2 and the second-1 terminal T2-1 to be connected to each other, the third filter F3 is connected to the second antenna ANTb, and the fourth filter F4 is connected to the first antenna ANT1. The third filter F3 and the fourth filter F4 may be connectable to different antenna terminals of the first antenna terminal ANTa and the second antenna terminal ANTb.

Figure 4A:
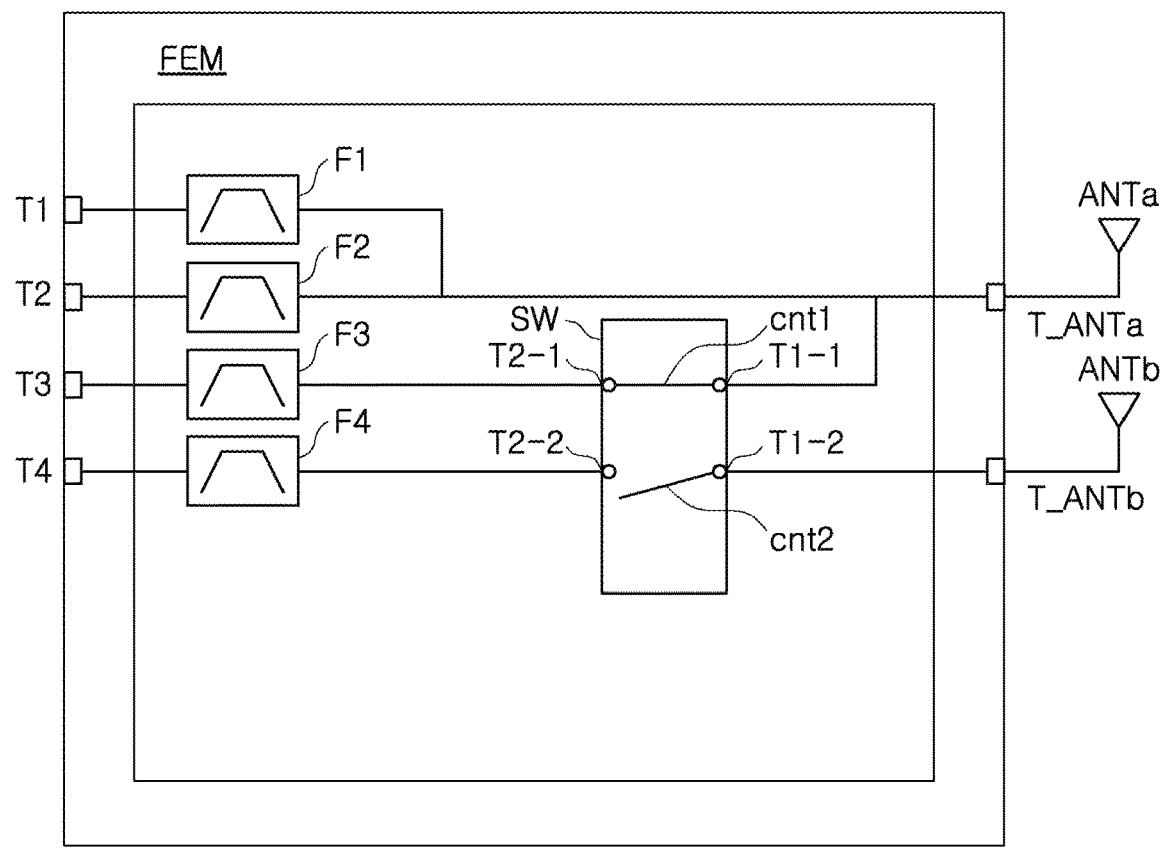
FIG. 4A is a block diagram of a front end module according to a first switching operation of a switch according to an example.
Figure 4B:
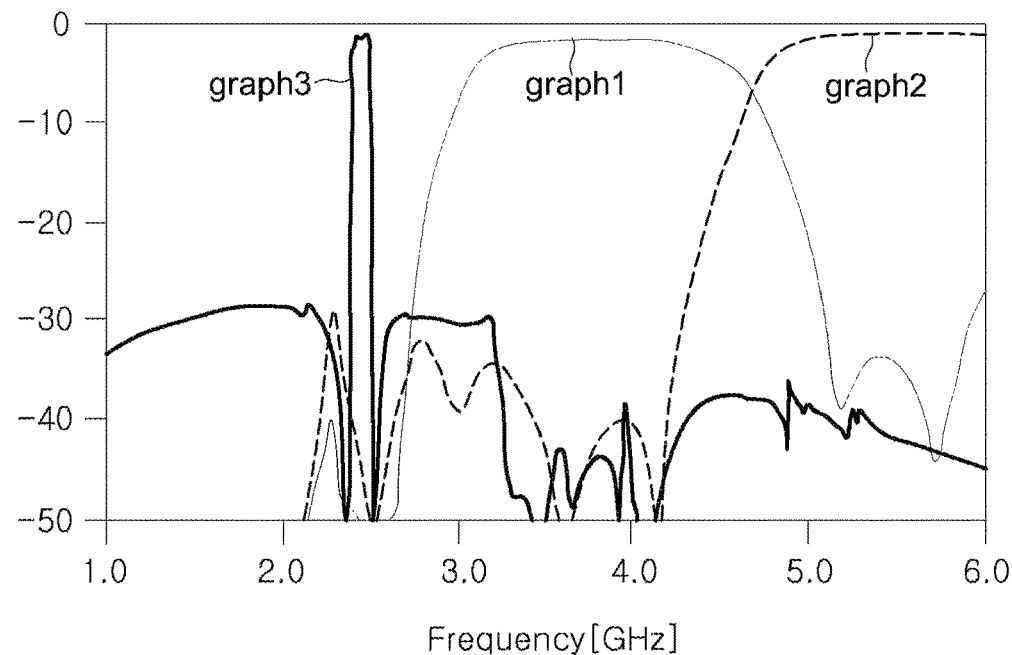
FIG. 4B illustrates a frequency response of a front end module according to a first switching operation of a switch according to an example.

FIG. 4A is a block diagram of a front end module according to a first switching operation of a switch according to an example, and FIG. 4B illustrates a frequency response of a front end module according to a first switching operation of a switch according to an example.

In FIG. 4B, a first graph (graph 1) illustrates a frequency response of a first filter F1, a second graph (graph 2) illustrates a frequency response of a second filter F2, and a third graph (graph 3) illustrates a frequency response of a third filter F3.

Referring to FIG. 4A, according to a first switching operation of a switch SW, the other end of the first connector cnt1 is connected to the second-1 terminal T2-1, so the first-1 terminal T1-1 is connected to the second-1 terminal T2-1. Moreover, the other end of the second connector cnt2 is off-operated, so the first-2 terminal T1-2 is not connected to either the second-1 terminal T2-1 or the second-2 terminal T2-2.

According to a first switching operation of the switch SW, the first antenna ANTa is connected to the first filter F1, the second filter F2, and the third filter F3. Due to the first filter F1 supporting cellular communications in a sub-6 GHz band, the second filter F2 supporting Wi-Fi communications in a 5 GHz band, and the third filter F3 supporting Wi-Fi communications in a 2.4 GHz band, a frequency response, illustrated in FIG. 4B, may be provided.

Figure 5A:
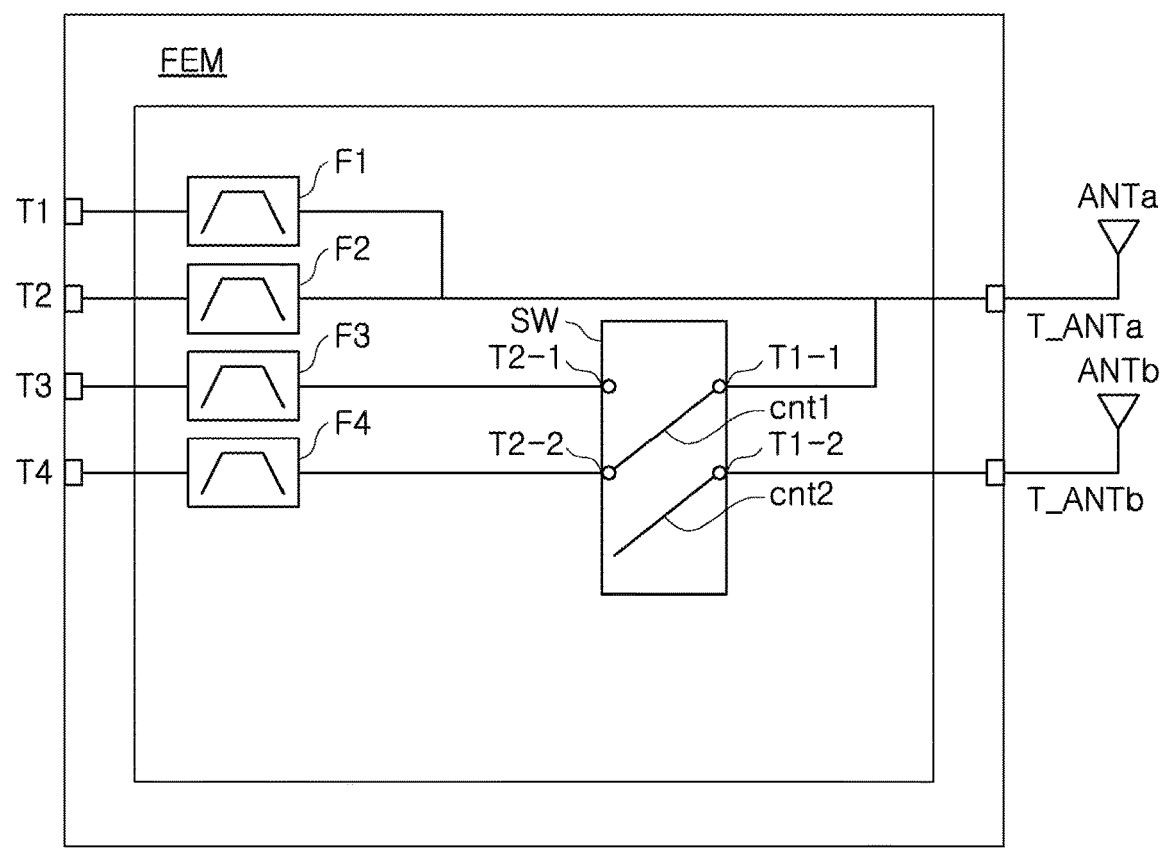
FIG. 5A is a block diagram of a front end module according to a second switching operation of a switch according to an example.
Figure 5B:
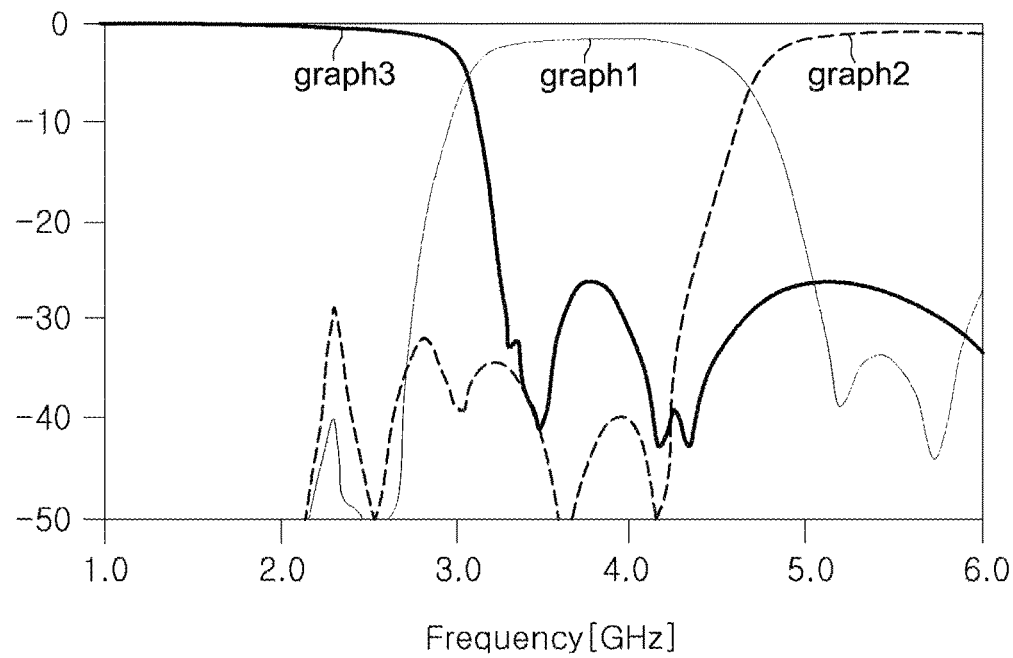
FIG. 5B illustrates a frequency response of a front end module according to a second switching operation of a switch according to an example.

FIG. 5A is a block diagram of a front end module according to a second switching operation of a switch according to an example, and FIG. 5B illustrates a frequency response of a front end module according to a second switching operation of a switch according to an example.

In FIG. 5B, a first graph (graph 1) illustrates a frequency response of a first filter F1, a second graph (graph 2) illustrates a frequency response of a second filter F2, and a third graph (graph 3) illustrates a frequency response of a fourth filter F4.

Referring to FIG. 5A, according to a second switching operation of a switch SW, the other end of the first connector cnt1 is connected to the second-2 terminal T2-2, so the first-1 terminal T1-1 is connected to the second-2 terminal T2-2. Moreover, the other end of the second connector cnt2 is off-operated, so the first-2 terminal T1-2 is not connected to either the second-1 terminal T2-1 or the second-2 terminal T2-2.

According to a second switching operation of the switch SW, the first antenna ANTa is connected to the first filter F1, the second filter F2, and the fourth filter F4. Due to the first filter F1 supporting cellular communications in a sub-6 GHz band, the second filter F2 supporting Wi-Fi communications in a 5 GHz band, and the fourth filter F4 supporting cellular communications in a sub-3 GHz band, a frequency response, illustrated in FIG. 5B, may be provided.

In FIGS. 4A and 5A, a switching operation, in which the first-1 terminal T1-1 is selectively connected to one of the second-1 terminal T2-1 and the second-2 terminal T2-2, and the first-2 terminal T1-2 is off-operated, is described, but the switch SW may be operated in various forms. As an example, the first-1 terminal T1-1 and the second-1 terminal T2-1 may be connected to each other, and the first-2 terminal T1-2 and the second-2 terminal T2-2 may be connected to each other. Moreover, the first-1 terminal T1-1 may not be connected to the second-1 terminal T2-1 and the second-2 terminal T2-2, and the first-2 terminal T1-2 is selectively connected to one of the second-1 terminal T2-1 and the second-2 terminal T2-2.

Figure 6A:
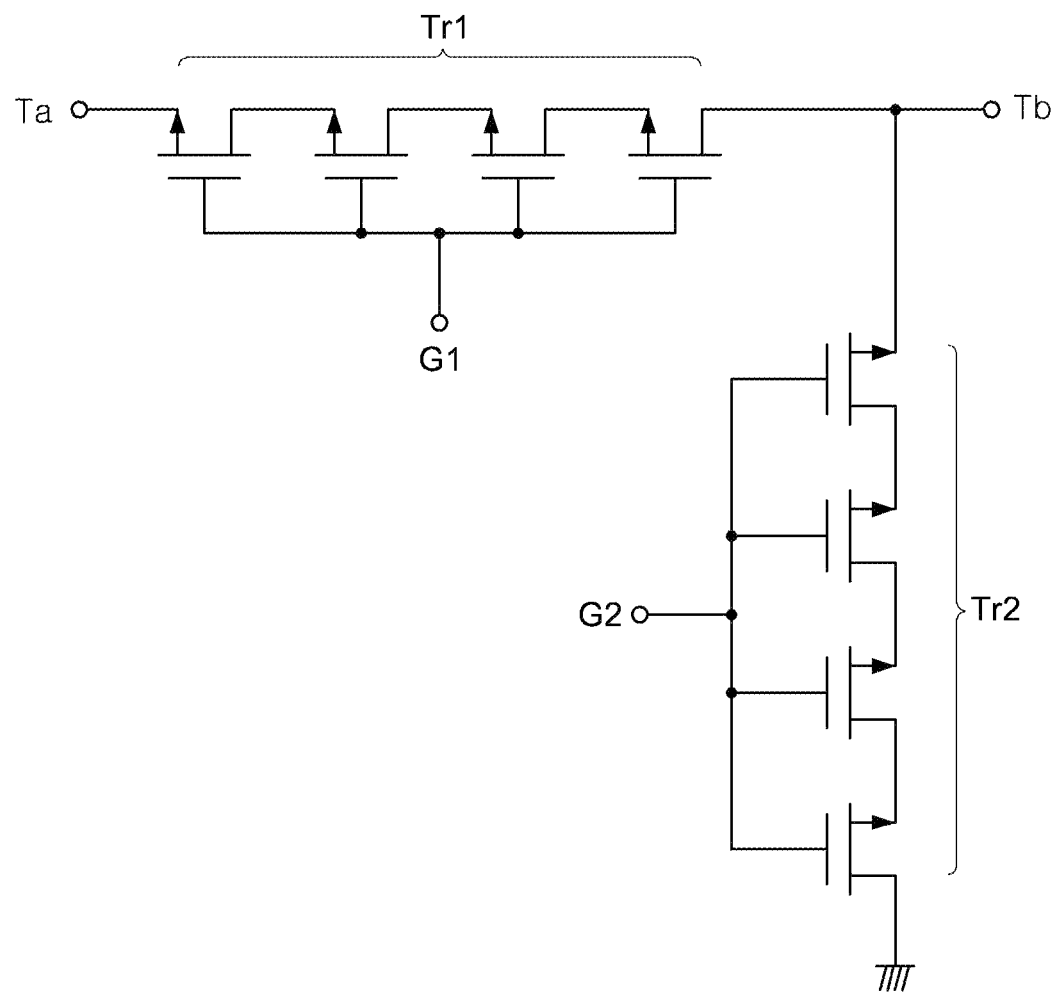
FIG. 6A is a schematic circuit diagram of a switch according to an example.
Figure 6B:
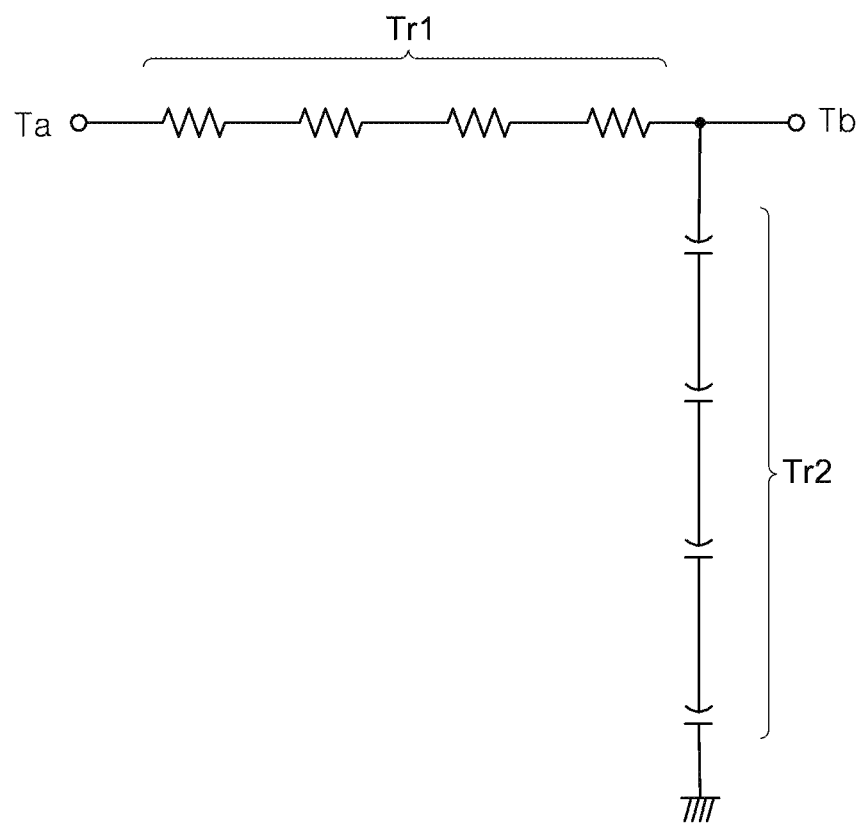
FIG. 6B is an equivalent circuit diagram when the switch of FIG. 6A is on-operated.
Figure 6C:
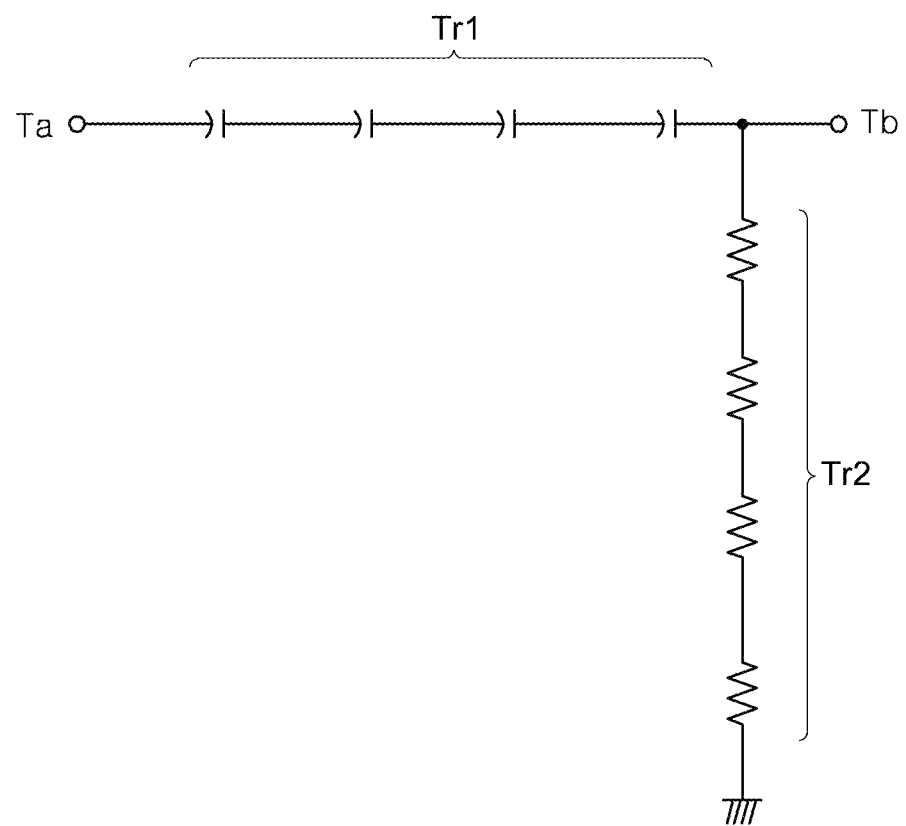
FIG. 6C is a circuit diagram when the switch of FIG. 6A is off-operated.

FIG. 6A is a schematic circuit diagram of a switch according to an example, FIG. 6B is an equivalent circuit diagram when the switch of FIG. 6A is on-operated, and FIG. 6C is a circuit diagram when the switch of FIG. 6A is off-operated. The configuration of the switch, illustrated in FIG. 6A, is illustrated by way of example, and the configuration of the switch can be modified in various forms.

Referring to FIG. 6A, a switch may include a plurality of first transistors Tr1, disposed in a signal transmission path between a terminal Ta and a terminal Tb and operated by a first control signal G1, and a plurality of second transistors Tr2, disposed between the terminal Tb and the ground and operated by a second control signal G2.

Referring to FIG. 6B, when a switch is on-operated, the plurality of first transistors Tr1 are on-operated by the first control signal G1, and equivalent to a resistance component. Moreover, the plurality of second transistors Tr2 are off-operated by the second control signal G2, and equivalent to a capacitor component.

Referring to FIG. 6C, when a switch is off-operated, the plurality of first transistors Tr1 are off-operated by the first control signal G1, and equivalent to a capacitor component. Moreover, the plurality of second transistors Tr2 are on-operated by the second control signal G2, and equivalent to a resistance component.

As described above, the other end of the first connector cnt1 is off-operated, so the first-1 terminal T1-1 may not be connected to any terminal among the second-1 terminal T2-1 and the second-2 terminal T2-2.

In this case, the first filter F1 and the second filter F2 are connected to the first antenna ANTa to transmit and receive RF signals. However, the RF signals, transmitted and received through the first filter F1 and the second filter F2, may be bypassed to the ground of FIG. 6C.

Figure 7:
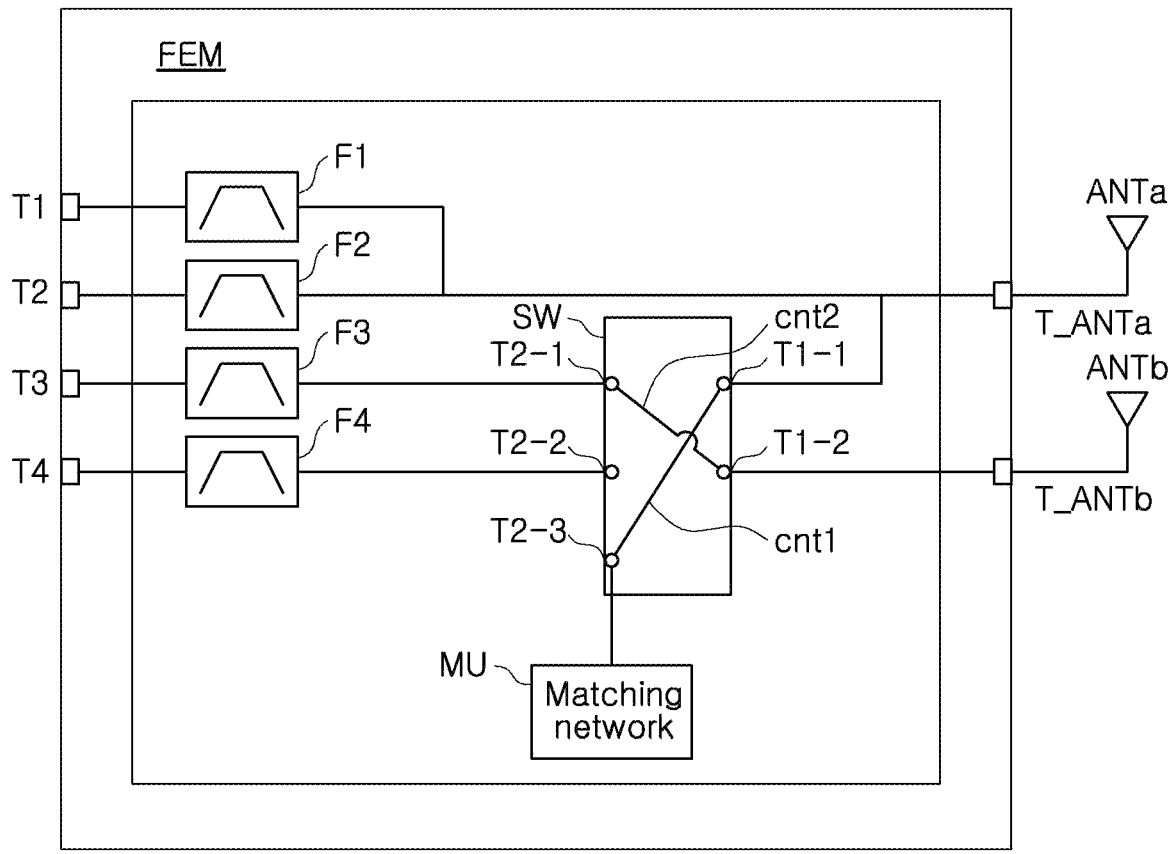
FIG. 7 is a block diagram of a front end module according to an example.

FIG. 7 is a block diagram of a front end module according to an example.

A front end module according to FIG. 7 is similar to a front end module according to FIG. 2, so duplicate descriptions are omitted and the differences will be explained.

Referring to FIG. 7, a front end module includes a matching unit MU having a matching network, and the switch SW may include a second-3 terminal T2-3, connected to the matching unit MU.

The first connector cnt1 of the switch SW is connected to the second-3 terminal T2-3, in an off-operation state, in which the first-1 terminal T1-1 is not connected to either the second-1 terminal T2-1 or the second-2 terminal T2-2.

The matching network, provided in the matching unit MU, secures a sufficiently large impedance. In this case, even when the first connector cnt1 allows the first-1 terminal T1-1 and the second-3 terminal T2-3 to be connected to each other, an open state may be provided, with respect to a signal path among the first antenna terminal T_ANTa, the first filter F1, and the second filter F2.

Thus, through the matching network of the matching unit MU, on the signal path among the first antenna terminal T_ANTa, the first filter F1, and the second filter F2, a problem, in which an RF signal is lost, may be solved.

When 40 dB of attenuation characteristics of the third filter F3 or the fourth filter F4 could be secured, with respect to a passband 3.3 GHz to 4.2 GHz of the first filter F1 and a passband 5.15 GHz to 5.950 GHz of the second filter F2, a front end module may be configured as illustrated in FIG. 7. However, if 40 dB of attenuation characteristics of the third filter F3 or the fourth filter F4 is not secured, with respect to a passband 3.3 GHz to 4.2 GHz of the first filter F1 and a passband 5.15 GHz to 5.950 GHz of the second filter F2, it is required to have an additional filter.

Moreover, when 40 dB of attenuation characteristics of the first filter F1 or the second filter F2 could be secured, with respect to a passband 2.4 GHz to 2.4835 GHz of the third filter F3 and a sub-3 GHz passband of the fourth filter F4, a front end module may be configured as illustrated in FIG. 7. However, if 40 dB of attenuation characteristics of the first filter F1 of the second filter F2 is not secured, with respect to a passband 2.4 GHz to 2.4835 GHz of the third filter F3 and a sub-3 GHz passband of the fourth filter F4, it is required to have an additional filter.

Figure 8:
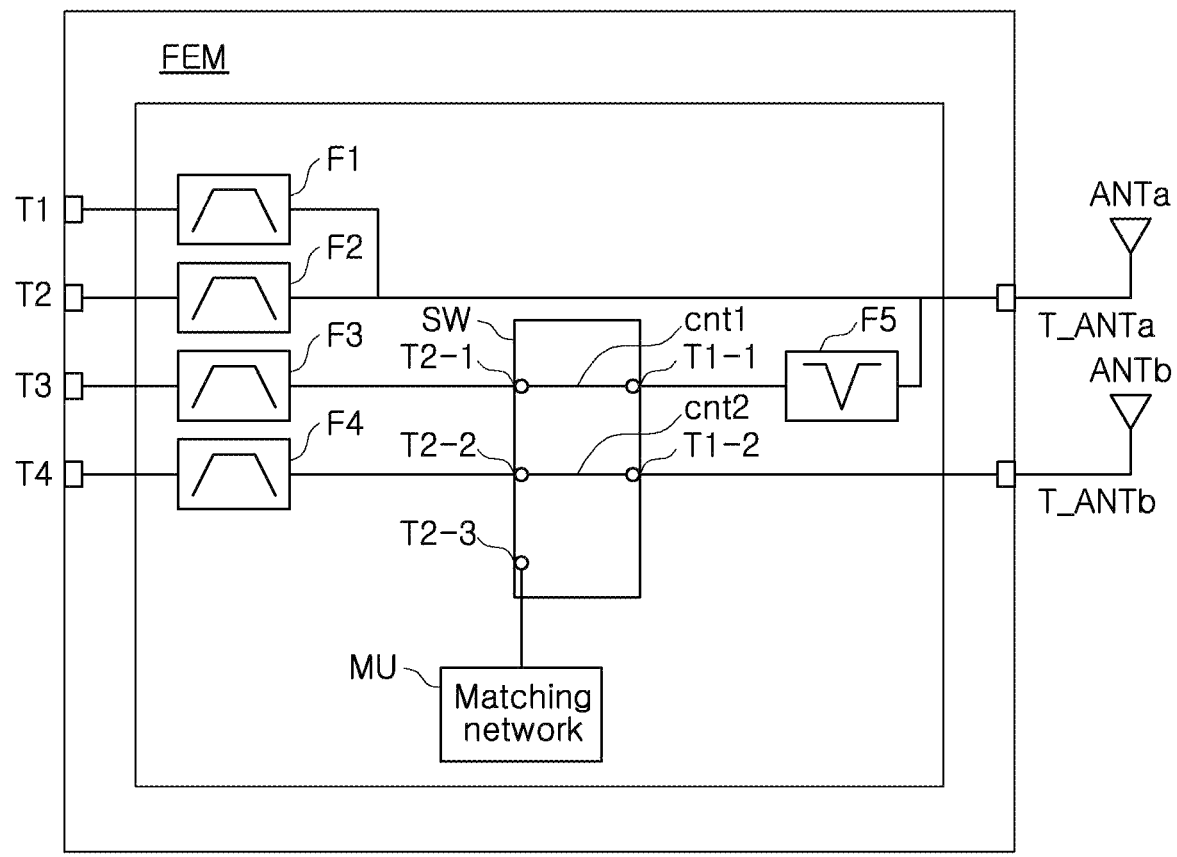
FIGS. 8 and 9 are block diagrams of a front end module according to an example.
Figure 9:
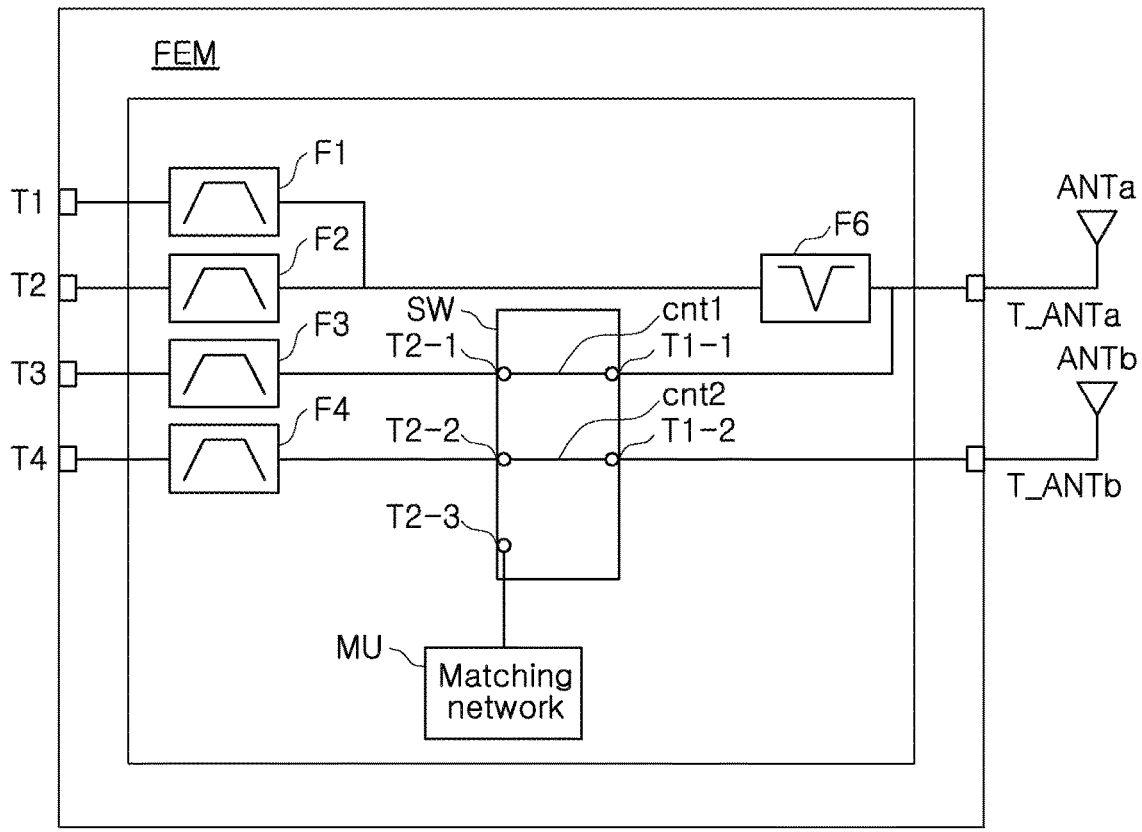

FIGS. 8 and 9 are block diagrams of a front end module according to an example.

Referring to FIG. 8, a front end module may include a fifth filter F5, disposed between the first antenna terminal T_ANTa and the first-1 terminal T1-1 of the switch SW. The fifth filter F5 may be composed of an LC filter.

The fifth filter F5 is operated as a band stop filter. As an example, the fifth filter F5 may be operated as a band stop filter having a lower frequency limit of 3.3 GHz and an upper frequency limit of 6.0 GHz.

The fifth filter F5 is disposed between the first-1 terminal T1-1 and the first antenna terminal T_ANTa. The fifth filter F5 is disposed in a signal path between the third filter F3 and the first antenna terminal T_ANTa, or a signal path between the fourth filter F4 and the first antenna terminal T_ANTa, thereby providing attenuation characteristics of 40 dB or more to the third filter F3 and the fourth filter F4.

Referring to FIG. 9, a front end module may include a sixth filter F6, disposed between the first antenna terminal T_ANTa and the first filter F1/the second filter F2. The sixth filter F6 may be composed of an LC filter.

The sixth filter F6 is operated as a band stop filter. As an example, the sixth filter F6 may be operated as a band stop filter having a lower frequency limit of 1.7 GHz and an upper frequency limit of 2.7 GHz.

The sixth filter F6 may be disposed in a signal path among the first antenna terminal T_ANTa, the first filter F1, and the second filter F2. The sixth filter F6 is disposed in a signal path between the first filter F1 and the first antenna terminal T_ANTa, or a signal path between the second filter F2 and the first antenna terminal T_ANTa, thereby providing attenuation characteristics of 40 dB or more to the first filter F1 and the second filter F2.

Figure 10:
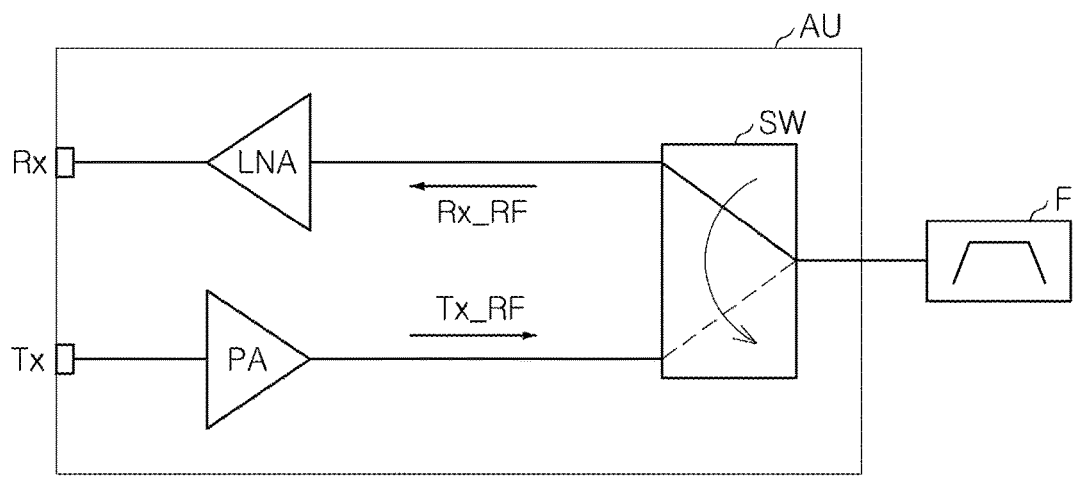
FIG. 10 is a block diagram illustrating an example of an amplifying unit connected to a filter according to an example.

FIG. 10 is a block diagram illustrating an example of an amplifying unit connected to a filter according to an example.

In FIG. 10, a filter F may be one among the first filter F1, the second filter F2, the third filter F3, and the fourth filter F4 according to the examples described above. Moreover, a receiving end Rx and a transmitting end Tx may be one among the first terminal T1 to the fourth terminal T4 according to various examples described herein. As an example, the first terminal T1 may include a receiving end Rx and a transmitting end Tx.

An amplifying unit AU may include a switch SW, a low noise amplifier (LNA), and a power amplifier (PA).

Referring to FIG. 10, the filter F is connected to each of one end of the low noise amplifier LNA and one end of the power amplifier PA, through the switch SW. The low noise amplifier LNA may be disposed in a receive path Rx_RF of an RF signal, and the power amplifier PA may be disposed in a transmit path Tx_RF of the RF signal. Moreover, the other end of the low noise amplifier LNA is connected to the receiving end Rx, and the other end of the power amplifier PA is connected to the transmitting end Tx.

In FIG. 10, it is illustrated that the low noise amplifier LNA is disposed in the receive path Rx_RF, and the power amplifier PA is disposed in the transmit path Tx_RF. However, depending on whether amplification is required or not due to the design, the low noise amplifier LNA may be removed from the receive path Rx_RF, or the power amplifier PA may be removed from the transmit path Tx_RF.

As set forth above, the number of antennas, employed in a mobile device, is reduced, so isolation characteristics of an antenna may be improved.

Moreover, a front end module according to various examples described herein may be applied to a mobile device having various types of platforms.

Further, a front end module may simultaneously support n77 band (3.3 GHz to 4.2 GHz), Wi-Fi 5 GHz band (5.15 GHz to 5.95 GHz), and Wi-Fi 2.4 GHz band (2.4 GHz to 2.4835 GHz), and may simultaneously support n77 band (3.3 GHz to 4.2 GHz), Wi-Fi 5 GHz band (5.15 GHz to 5.95 GHz), and LTE MB/HB band (1.7 GHz to 2.0 GHz/2.3 GHz to 2.7 GHz).

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A front end module, comprising:
   a first antenna terminal connected to a first antenna;
   a second antenna terminal connected to a second antenna;
   a switch comprising a plurality of first side terminals and a plurality of second side terminals opposite to the first side terminals, each of the first side terminals being connected to one of the first antenna terminal and the second antenna terminal;
   a first filter connected to the first antenna terminal, and having a passband of a first frequency band, the first filter comprising an inductor-capacitor filter;
   a second filter connected to the first antenna terminal, and having a passband of a second frequency band, the second filter comprising an inductor-capacitor filter;
   a third filter connected to a first one of the second side terminals, the third filter being configured to be connected to one of the first antenna terminal and the second antenna terminal, and having a passband of a third frequency band, the third filter comprising a bulk acoustic wave filter;
   a fourth filter connected to a second one of the second side terminals, the fourth filter being configured to be connected to one of the first antenna terminal and the second antenna terminal, and having a passband of a fourth frequency band, the fourth filter comprising an inductor-capacitor filter; and
   a matching unit comprising a matching network,
   wherein the first side terminals include a first terminal connected to the first antenna terminal and a second terminal connected to the second antenna terminal, and the second side terminals include a third terminal connected to the third filter, and a fourth terminal connected to the fourth filter,
   wherein the switch comprises:
      a first connector having a first end connected to the first terminal, and a second end configured to be connected to one of the third terminal and the fourth terminal or unconnected;

a second connector having a first end connected to the second terminal, and a second end configured to be connected to one of the third terminal and the fourth terminal or unconnected; and a fifth terminal connected to the matching network and configured to provide an open state, with respect to a signal path among the first antenna terminal, the first filter, and the second filter, and wherein the first connector is connected to the fifth terminal in a case in which the first terminal is not connected to either the third terminal or the fourth terminal.

2. The front end module of claim 1, wherein one of the third terminal and the fourth terminal is connected to no more than one of the first connector and the second connector.

3. The front end module of claim 1, wherein the second end of the first connector is connected to the third terminal, and the second end of the second connector is connected to the fourth terminal.

4. The front end module of claim 1, wherein the second end of the first connector is connected to the fourth terminal, and the second end of the second connector is connected to the third terminal.

5. The front end module of claim 1, further comprising:
a fifth filter disposed between the first antenna terminal and the first terminal, and configured to provide attenuation characteristics of 40 dB or more to the third filter and the fourth filter.

6. The front end module of claim 5, further comprising:
a sixth filter disposed in a signal path among the first antenna terminal, the first filter, and the second filter, and configured to provide attenuation characteristics of 40 dB or more to the first filter and the second filter.

7. The front end module of claim 1, wherein the first filter supports cellular communications in a sub-6 GHz band,
the second filter supports Wi-Fi communications in a 5 GHz band,
the third filter supports Wi-Fi communications in a 2.4 GHz band, and
the fourth filter supports cellular communications in a sub-3 GHz band.

8. The front end module of claim 1, wherein the first filter supports cellular communications in a 3.3 GHz to 4.2 GHz band (n77 band) or in a 3.3 GHz to 3.8 GHz band (an n78 band),
the second filter supports Wi-Fi communications in a 5.15 GHz to 5.950 GHz band,
the third filter supports Wi-Fi communications in a 2.4 GHz to 2.4835 GHz band, and
the fourth filter supports cellular communications in a 1.7 GHz to 2.0 GHz band (LTE MB) or in a 2.3 GHz to 2.7 GHz band (LTE HB).

9. A front end module, comprising:
a first antenna terminal connected to a first antenna;
a second antenna terminal connected to a second antenna;
a switch including a plurality of first side terminals on a first side and a plurality of second side terminals on a second side opposite to the first side, each of the first side terminals being connected to one of the first antenna terminal and the second antenna terminal;
at least one main filter connected to the first antenna terminal, the main filter comprising an inductor-capacitor filter;
a plurality of subfilters, each of the plurality of subfilters being connected to a different one of the second side terminals and configured to be connected to a different one of the first antenna terminal and the second antenna terminal, the plurality of subfilters including a first subfilter comprising a bulk acoustic wave filter and a second subfilter comprising inductor-capacitor filter; and
a matching unit comprising a matching network,
wherein the first side terminals include a first terminal connected to the first antenna terminal and a second terminal connected to the second antenna terminal, and the second side terminals include a third terminal connected to the first subfilter, and a fourth terminal connected to the second subfilter,
wherein the switch comprises:
a first connector having a first end connected to the first terminal, and a second end connected to one of the third terminal and the fourth terminal or unconnected;
a second connector having a first end connected to the second terminal, and a second end connected to one of the third terminal and the fourth terminal or unconnected; and
a fifth terminal connected to the matching network and configured to provide an open state, with respect to a signal path between the first antenna terminal and the at least one main filter, and
wherein the first connector is connected to the fifth terminal in a case in which the first terminal is not connected to either the third terminal or the fourth terminal.

* * * * *